United States Patent
Lukoff

(10) Patent No.: US 7,391,348 B2
(45) Date of Patent: Jun. 24, 2008

(54) REDUCING NOISE ASSOCIATED WITH LOCAL REFERENCE-POTENTIAL FLUCTUATIONS IN MIXED-SIGNAL INTEGRATED CIRCUITS

(75) Inventor: Arthur Lukoff, Wescosville, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/551,831

(22) Filed: Oct. 23, 2006

(65) Prior Publication Data

US 2008/0094266 A1   Apr. 24, 2008

(51) Int. Cl.
*H03M 1/06* (2006.01)
(52) U.S. Cl. .................. 341/118; 341/119; 341/120
(58) Field of Classification Search ........ 341/118–120, 341/122; 327/307
See application file for complete search history.

(56) References Cited

U.S. PATENT DOCUMENTS 5,841,308 A * 11/1998 Nagata ..................... 327/307
6,191,715 B1 * 2/2001 Fowers ..................... 341/120
6,208,190 B1   3/2001 Lukoff
6,570,516 B1 * 5/2003 Barker ...................... 341/122

\* cited by examiner

*Primary Examiner*—Jean B Jeanglaude
(74) *Attorney, Agent, or Firm*—Mendelsohn & Associates, P.C.; Yuri Gruzdkov; Steve Mendelsohn

(57) ABSTRACT

An integrated circuit (IC) adapted to (i) measure a voltage differential between a ground potential external to the IC and a ground potential internal to the IC and (ii) based on the measurement result(s), adjust a signal referenced to the internal ground potential to reduce signal error associated with the voltage differential. In one embodiment, the IC is adapted to monitor the voltage differential in real time and use the presently measured voltage differential to perform signal adjustment. In another embodiment, the IC has a plurality of registers, each register adapted to store a voltage-differential value corresponding to a particular configuration of the IC, which values are written into the registers during an initialization procedure. During normal operation, the IC controllably selects from the stored values one corresponding to the current IC configuration.

20 Claims, 6 Drawing Sheets

200

300

400

500

600

700

REDUCING NOISE ASSOCIATED WITH LOCAL REFERENCE-POTENTIAL FLUCTUATIONS IN MIXED-SIGNAL INTEGRATED CIRCUITS

BACKGROUND OF THE INVENTION

1. Field of the Invention

The present invention relates to reducing effects of digital-circuit switching on analog circuitry located within the same integrated circuit (IC) and, more specifically, to reducing effects of local reference-potential fluctuations induced by digital-circuit switching.

2. Description of the Related Art

Mixed-signal ICs have both analog and digital circuits formed on a common substrate. For example, a mixed-signal IC may contain an analog circuit, such as an operational amplifier, a digital-to-analog converter (DAC), and/or an analog-to-digital converter (ADC), as well as a digital circuit, such as a digital signal processor (DSP). A representative mixed-signal application might involve (i) converting an analog input signal into a corresponding digital signal using an ADC, (ii) processing the data using a DSP, and (iii) converting the processed data into an analog output signal using a DAC.

Various forms of noise can be communicated from digital to analog circuits within a mixed-signal IC via the common substrate. One form of such noise (often referred to as digital switching noise) is caused by switching ON and OFF the mixed-signal IC's digital circuit or a portion thereof. Digital circuits, for example, generate high frequencies and harmonics and other noise due, in part, to the sharp edges of the digital waveforms used for clock signals and the like. This digital circuit noise can be communicated to sensitive analog circuit sections in the IC through the common substrate and can adversely affect their operation because analog signals are typically referenced to the local ground potential, and not to the external one. For example, in a representative mixed-signal IC, for a digital current of about 80 mA, the digital substrate might become biased with respect to the external ground potential by about 4 mV. Due to low substrate resistivity, voltage shifts induced in the digital substrate are coupled into the analog substrate. As a result, analog signals in the IC can shift by about 4 mV each time the IC's digital circuits are turned ON. For a 13-bit DAC with a least-significant-bit (LSB) voltage step of about 0.5 mV, a 4-mV ground-potential bias amounts to an error of about 8 LSBs, which is a rather significant amount.

SUMMARY OF THE INVENTION

Embodiments of the invention provide an integrated circuit (IC) adapted to (i) measure a voltage differential between a reference (e.g., ground) potential external to the IC and a reference (e.g., ground) potential internal to the IC and (ii) based on the measurement result(s), adjust a signal referenced to the internal ground potential to reduce signal error associated with the voltage differential. The IC can be designed to perform signal adjustment in the analog domain and/or in the digital domain. In one embodiment, the IC is adapted to monitor the voltage differential in real time and use the presently measured voltage differential to perform signal adjustment. In another embodiment, the IC has a plurality of registers, each register adapted to store a voltage-differential value corresponding to a particular configuration of the IC, which values are written into the registers during an initialization procedure. During normal operation, the IC controllably selects from the stored values one corresponding to the current IC configuration. The IC can change the selection if the present IC configuration changes.

According to one embodiment, the present invention is an integrated circuit comprising: (1) a first circuit adapted to be coupled to a terminal held at an external reference potential so that a current passing through the first circuit is coupled to said terminal; (2) a second circuit electrically coupled to the first circuit and adapted to generate a signal referenced to a reference potential internal to the integrated circuit, wherein the current causes said internal reference potential to be offset with respect to the external reference potential; and (3) a third circuit electrically coupled to the second circuit and adapted to: (i) measure an offset voltage; and (ii) based on the measured offset voltage, adjust the signal referenced to the internal reference potential to reduce signal error associated with the offset between the internal and external reference potentials.

According to another embodiment, the present invention is a method of signal generation comprising: (1) passing current through a first circuit of an integrated circuit coupled to a terminal held at an external reference potential so that the current is coupled to said terminal; (2) generating a signal referenced to a reference potential internal to the integrated circuit using a second circuit of said integrated circuit, wherein the current causes said internal reference potential to be offset with respect to the external reference potential; (3) measuring an offset voltage using a third circuit of said integrated circuit; and (4) based on the measured offset voltage, adjusting the signal referenced to the internal reference potential to reduce signal error associated with the offset between the internal and external reference potentials.

BRIEF DESCRIPTION OF THE DRAWINGS

Other aspects, features, and benefits of the present invention will become more fully apparent from the following detailed description, the appended claims, and the accompanying drawings in which:

DETAILED DESCRIPTION

Figure 1:
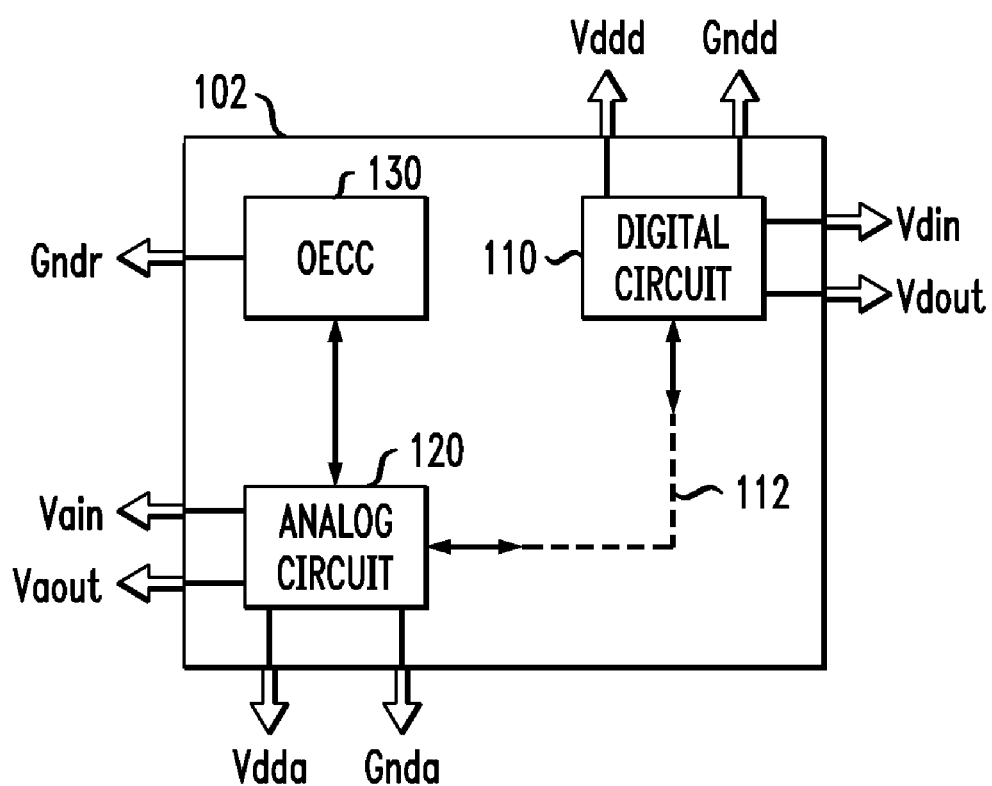
FIG. 1 shows a block diagram of a mixed-signal integrated circuit (IC) according to one embodiment of the invention.

FIG. 1 shows a block diagram of a mixed-signal integrated circuit (IC) 100 according to one embodiment of the invention. IC 100 has a digital circuit 110, an analog circuit 120, and an offset error correction circuit (OECC) 130, all formed on a common substrate 102. Digital circuit 110 and analog circuit 120 can (but do not have to) be coupled to one another, e.g., as indicated in FIG. 1, where signal 112 illustrates a digital signal applied by the digital circuit to the analog circuit for digital-to-analog conversion or, alternatively, a digital signal generated by analog-to-digital conversion in the analog circuit and applied to the digital circuit for further processing therein. OECC 130 is coupled to analog circuit 120 and is designed to reduce signal error associated with fluctuations of the local ground potential to which the analog circuit is referenced. Operation and representative embodiments of OECC 130 are described in more detail below. IC 100 can also contain other circuits variously coupled to circuits 110, 120, and 130, which other circuits are not explicitly shown in FIG. 1.

IC 100 has various pins, only several of which are shown in FIG. 1. Digital circuit 110 is powered via power pin Vddd and ground pin Gndd. In one embodiment, digital circuit 110 is also connected to pins labeled Vdin and Vdout, which pins handle digital input and output signals, respectively. Alternatively, a single (bidirectional) pin can be used for both digital input and output signals, or one or both of pins Vdin and Vdout might be absent if IC 100 is designed to (i) only receive digital signals, (ii) only output digital signals, or (iii) process only internally generated digital signals. Similarly, analog circuit 120 is powered via power pin Vdda and ground pin Gnda. In one embodiment, analog circuit 120 is also connected to pins labeled Vain and Vaout, which pins handle analog input and output signals, respectively. Alternatively, pin Vain or Vaout might be absent if IC 100 is designed to (i) only receive analog signals or (ii) only output analog signals. OECC 130 is connected to pin Gndr, which is configured so that there is no significant current flow through that pin. As explained in more detail below, pin Gndr is used to obtain an accurate representation of an external (reference) ground potential supplied to IC 100.

Figure 2A:
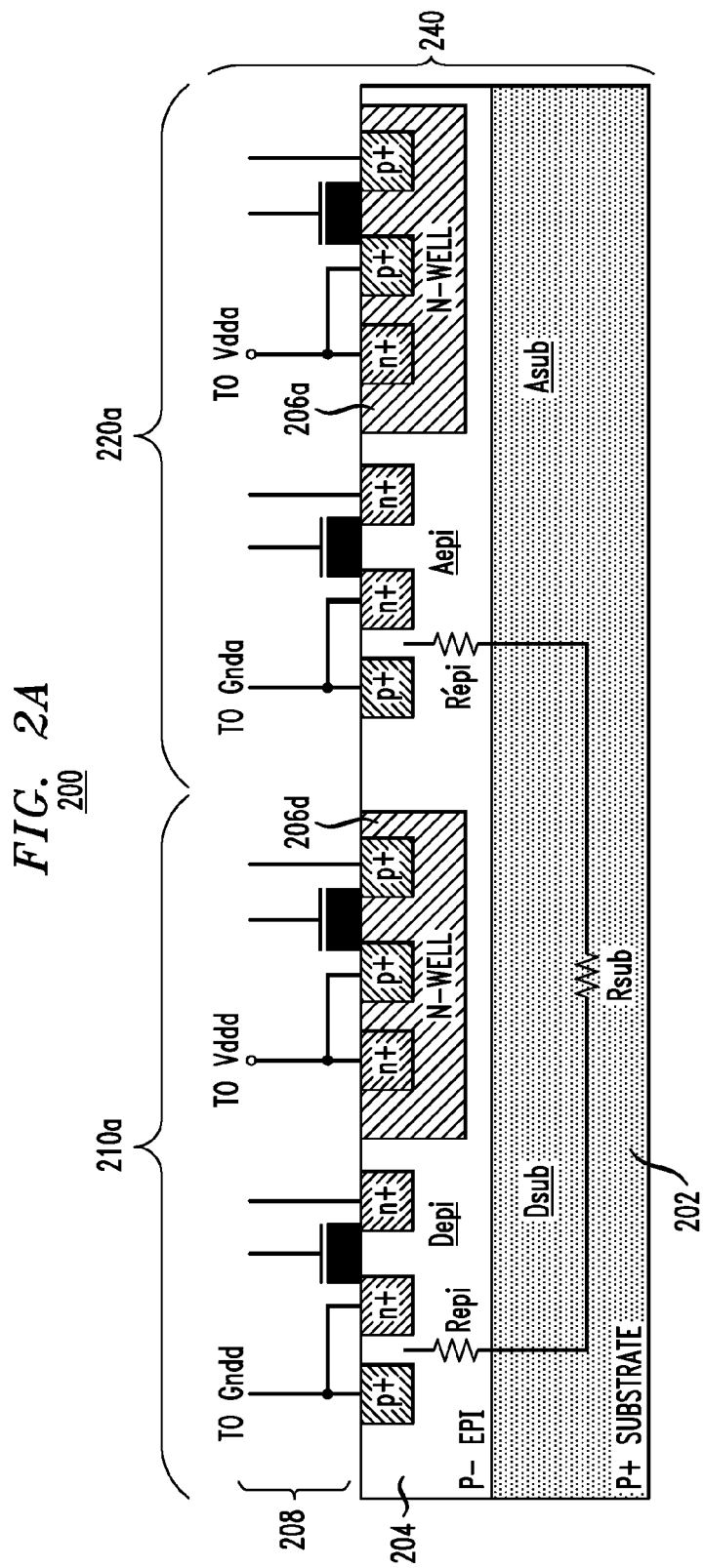
FIGS. 2A-B illustrate an IC that can be used as the IC shown in FIG. 1 according to one embodiment of the invention.
Figure 2B:
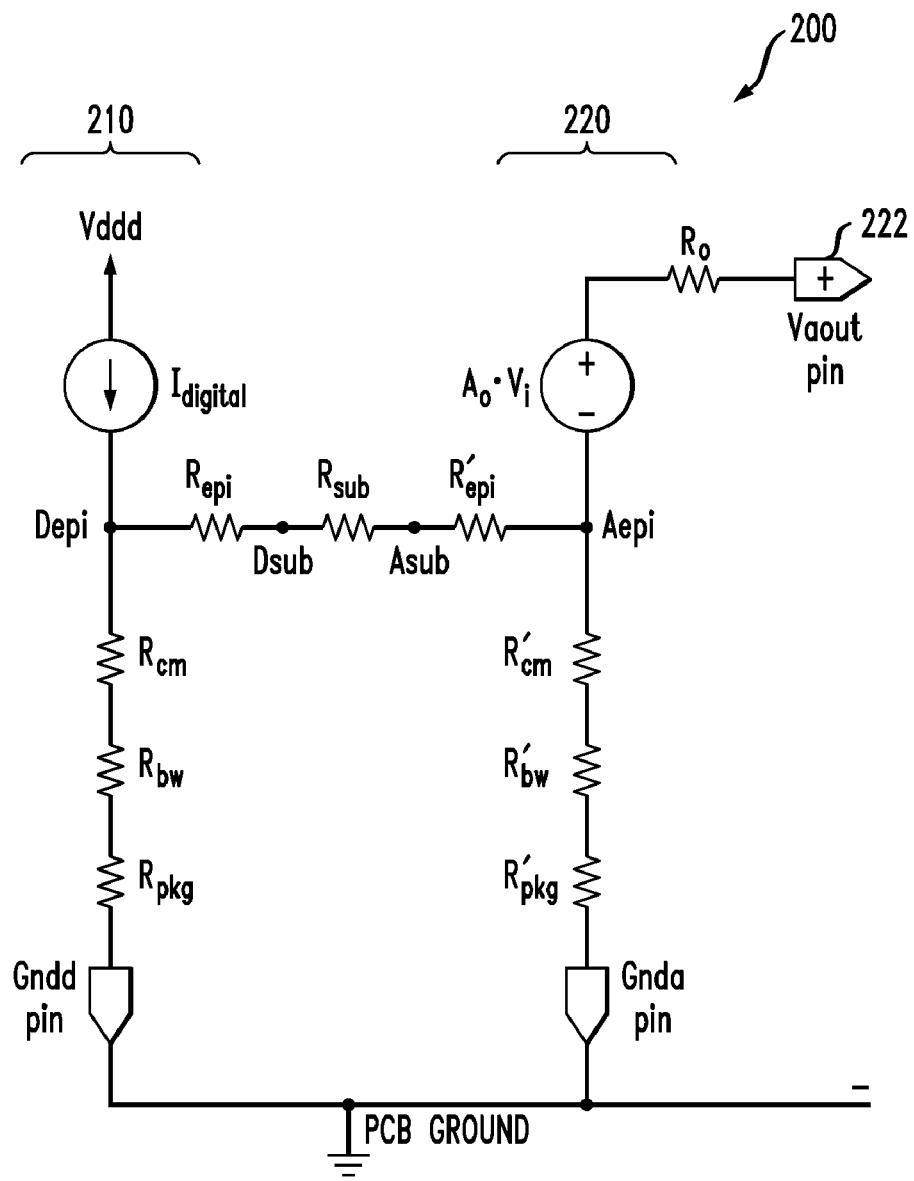

FIGS. 2A and 2B illustrate an IC 200 that can be used as IC 100 according to one embodiment of the invention. IC 200 has a digital circuit 210 and an analog circuit 220 that are analogous to digital circuit 110 and analog circuit 120, respectively, of IC 100. More specifically, FIG. 2A shows a cross-sectional side view of a digital circuit 210a (which is a small section of digital circuit 210) and an analog circuit 220a (which is a small section of analog circuit 220) of IC 200. FIG. 2B shows, from a chip level perspective, a schematic circuit diagram illustrating certain electrical connections and resistances of the entire IC 200. Note that the resistances depicted in FIG. 2A represent local resistances within a small section of the analog and digital circuits, while the resistances in FIG. 2B represent the collective summation of all the individual local resistances in each individual analog and digital circuit on the chip. In addition, FIG. 2B is a considerable simplification of the actual circuit, as understood by those knowledgeable in the art, presented in order to explain the offset issue. In particular, there are no singular points Depi, Dsub, Asub, and Aepi as shown in FIG. 2B due to the distributed nature of the corresponding physical structures.

Referring first to FIG. 2A, IC 200 is fabricated using a semiconductor wafer 240. Wafer 240 has (i) a P+ substrate 202, (ii) a P− epitaxial layer 204 deposited over the substrate, (iii) a plurality of N-wells 206, only two of which (wells 206a and 206d) are shown in FIG. 2A, and (vi) an interconnect structure 208. Circuit elements of circuits 210 and 220 are formed using N+ and P+ diffusions into both epitaxial layer 204 and wells 206d and 206a, respectively, as indicated in FIG. 2A. Interconnect structure 208 connects digital circuit 210 to pins Vddd and Gndd that are analogous to pins Vddd and Gndd, respectively, of IC 100 (see FIG. 1). Note that a portion of epitaxial layer 204 labeled Depi provides a local ground potential for digital circuit 210. Interconnect structure 208 similarly connects analog circuit 220 to pins Vdda and Gnda that are analogous to pins Vdda and Gnda, respectively, of IC 100 (see FIG. 1). A portion of epitaxial layer 204 labeled Aepi provides a local ground potential for analog circuit 220. Although FIG. 2A depicts an N-well process, the subject of this disclosure is not limited to this specific process and will work with other process technologies known in the art.

Referring now to both FIGS. 2A and 2B, portion Depi of epitaxial layer 204 is electrically connected to pin Gndd via a corresponding P+ diffusion and resistances $R_{cm}$, $R_{bw}$, and $R_{pkg}$, with the latter being the on-chip metallization resistance, the bond wire resistance, and the package lead resistance, respectively, corresponding to digital circuit 210. Of these three resistances, the bond wire resistance is generally the largest. Depi is also electrically connected to substrate 202 (Dsub) through a P−/P+ junction. Similarly, portion Aepi of epitaxial layer 204 is electrically connected to pin Gnda via a corresponding P+ diffusion and resistances $R'_{cm}$, $R'_{bw}$, and $R'_{pkg}$, with the latter being the on-chip metallization resistance, the bond wire resistance, and the package lead resistance, respectively, corresponding to analog circuit 220. Aepi is also electrically connected to substrate 202 (Asub) through a P−/P+ junction. As shown in FIG. 2A, $R_{epi}$ and $R'_{epi}$ are representative of the epitaxial layer resistances of digital section 210a and analog section 220a, respectively. In addition, $R_{sub}$ is representative of the resistance of the electrical connection through substrate 202 (Dsub+Asub). Note that resistances $R_{epi}$, $R'_{epi}$, and $R_{sub}$ in FIG. 2A are distributed resistances corresponding to the respective physical portions of IC 200.

In a typical configuration, pins Gndd and Gnda of IC 200 are connected, as indicated in FIG. 2B, to a ground terminal of the printed circuit board (PCB) having IC 200. When digital circuit 210 is ON, current $I_{digital}$ flows from power pin Vddd, through the digital circuit, to ground pin Gndd. Due to the non-negligible values of resistance $R_{cm}+R_{bw}+R_{pkg}$, this current flow causes a voltage differential ($V_{offset}$) to appear between portion Depi and pin Gndd.

Analog circuit 220 is shown in FIG. 2B as comprising an analog amplifier represented by a voltage source of $A_0V_i$, where $V_i$ is the input voltage applied to the amplifier and $A_0$ is the amplifier's gain. The voltage source is coupled to pin Vaout via output resistance $R_O$ and to ground pin Gnda via resistances $R'_{cm}$, $R'_{bw}$, and $R'_{pkg}$. When Depi becomes biased with respect to the PCB ground, the offset ($V_{offset}$) couples to Aepi through resistances $R_{epi}$, $R_{sub}$, and $R'_{epi}$. Typically, $R_{cm}$, $R_{bw}$, and $R_{pkg}$ are smaller than $R'_{cm}$, $R'_{bw}$, and $R'_{pkg}$ and current $I_{digital}$ is significantly larger than the analog current flowing through voltage source $A_0V_i$. As a result, a significant portion of $V_{offset}$ is observed at Aepi, thereby contributing to the voltage differential between pins Gnda and Vaout, which represents an analog output signal 222 generated by analog circuit 220.

During normal operation of IC 200, digital circuit 210 can be periodically turned ON and OFF. For example, digital circuit 210 might be turned OFF (put to "sleep") to save power and turned ON again ("awakened") when its functionality is requested by IC 200. As clear from the above description, each time digital circuit 210 is turned ON, signal 222 may change by as much as $V_{offset}$ even if all other configuration parameters for analog circuit 220 remain unchanged. Since $V_{offset}$ depends on whether digital circuit 210 is ON and on the value Of $I_{digital}$, the value of $V_{offset}$ can fluctuate rather asynchronously with respect to the analog amplifier, $A_0V_i$, and therefore may adversely affect analog output 222. One skilled in the art will appreciate that any other analog signal referenced to portion Aepi of epitaxial layer 204, e.g., an analog input signal (not shown) received by analog circuit 220, can be similarly adversely affected.

Prior-art attempts to reduce adverse effects of a fluctuating local ground potential induced by digital-circuit switching on analog circuitry in a mixed-signal IC are reviewed, e.g., in U.S. Pat. No. 6,208,190, which is incorporated herein in its entirety. Briefly, in reference to IC 200, these prior-art attempts would include (i) various isolation techniques, (ii) use of differential circuitry and I/O to cancel common node noise, (iii) use of low-noise digital circuitry, (iv) synchronizing analog and digital circuits, (v) using a combination of additional ground pins, bond wires, and improved power distribution, etc. However, disadvantageously, these and other prior-art attempts are not always sufficient, practical, feasible, and/or cost-effective for solving the above-outlined problem.

Figure 3:
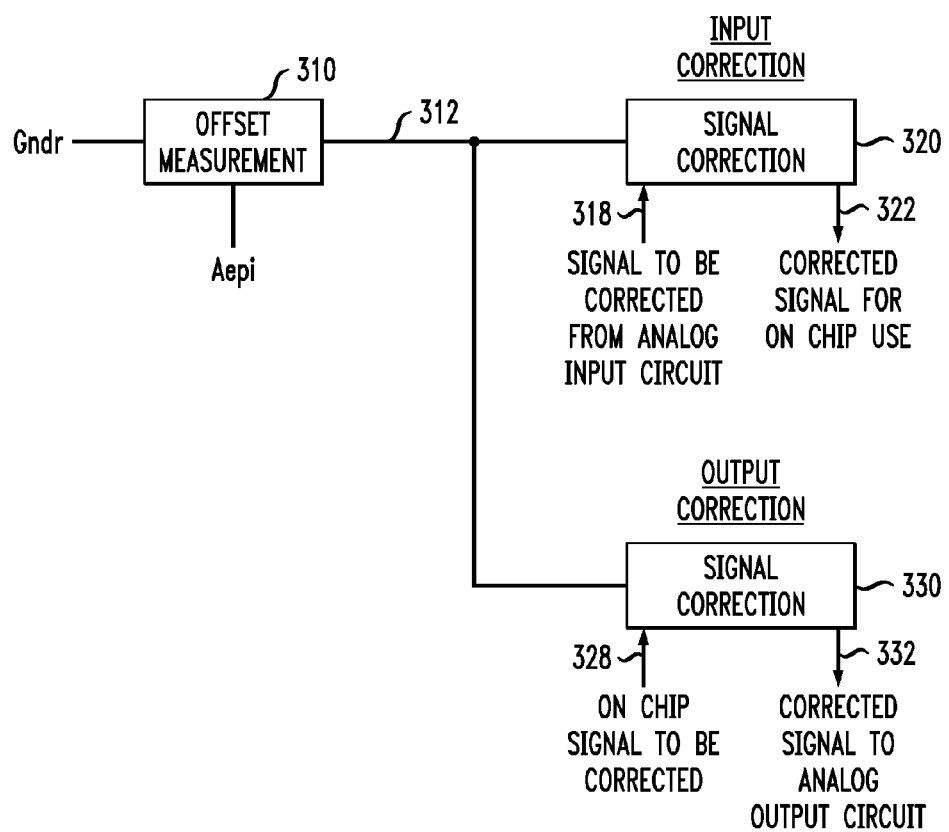
FIG. 3 shows a block diagram of an offset error correction circuit (OECC) that can be used in the IC of FIG. 1 according to one embodiment of the invention.

FIG. 3 shows a block diagram of an offset error correction circuit (OECC) 300 that can be used as OECC 130 (FIG. 1) according to one embodiment of the invention. OECC 300 has an offset measurement circuit 310 and signal correction circuits 320 and 330. Circuit 310 is coupled to pin Gndr (see FIG. 1), which is adapted to be connected to the PCB ground terminal (see FIG. 2B). As already mentioned above, pin Gndr is configured so that there is no significant current flow through that pin. As a result, the electric potential of pin Gndr is an accurate representation of the PCB ground potential. Circuit 310 is also coupled to portion Aepi (see FIG. 2) and, as a result, can sense the local ground potential of the corresponding analog circuit, e.g., circuit 120 (FIG. 1) or circuit 220 (FIG. 2). As clear from the above description, the voltage differential between pin Gndr and portion Aepi is the offset voltage, which voltage is measured by circuit 310. Circuit 310 then applies the measurement result via that circuit's output signal 312 to circuits 320 and 330. In one embodiment, circuit 310 is a differential amplifier, whose inputs are connected to pin Gndr and portion Aepi, respectively, and whose differential output is signal 312.

The output of circuit 310 can be used to monitor the voltage $V_{offset}$ in real time or, alternatively, captured during an initialization procedure, e.g., at power-up, for the IC having OECC 300. In the latter case, the IC is stepped through a series of different reference configurations or operating regimes, for each of which voltage $V_{offset}$ is measured, and the measurement results are stored in an on-chip register. During normal operation of the IC, circuit 310 is not active but, instead, the stored values of the offset voltage are used to approximate the present offset voltage. More details on a representative implementation of this initialization procedure are given below.

Circuit 320 is adapted to perform correction of analog input signals, only one of which, signal 318, is explicitly shown in FIG. 3. Signal 318 is typically received from the analog input circuitry of IC 100 or 200 and can be affected by the above-described adverse effects of local-ground-potential fluctuations. Circuit 320 uses the offset voltage value(s) provided to it via signal 312 to adjust signal 318 by an appropriate amount, and the resulting adjusted signal (i.e., signal 322) is retrieved from circuit 320 for intended on-chip use.

Circuit 330 is adapted to perform correction of analog output signals, only one of which, signal 328, is explicitly shown in FIG. 3. Signal 328 is typically an on-chip signal that needs to be corrected to reduce the adverse effects of local-ground-potential fluctuations. Circuit 330 uses the offset voltage value(s) provided to it via signal 312 to adjust signal 328 by an appropriate amount, and the resulting adjusted signal (i.e., signal 332) is output from the IC for intended external use. In various embodiments, circuits 320 and 330 can be designed to perform signal correction in the analog domain or in the digital domain, as further detailed below.

Figure 4:
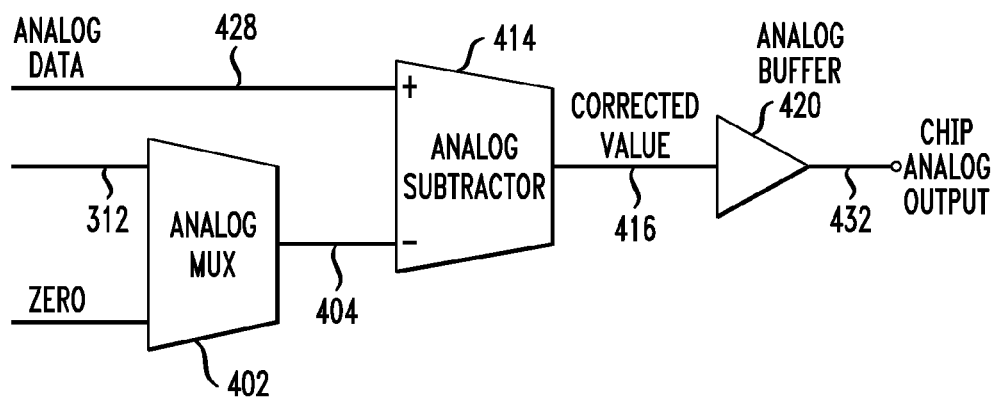
FIG. 4 shows a block diagram of a signal correction circuit that can be used in the OECC shown in FIG. 3 according to one embodiment of the invention.

FIG. 4 shows a block diagram of a signal correction circuit 400 that can be used as circuit 330 (FIG. 3) according to one embodiment of the invention. More specifically, circuit 400 is adapted to perform signal correction in the analog domain. Circuit 400 receives an analog signal 428 and generates a corrected analog signal 432 that are analogous to signals 328 and 332, respectively, of FIG. 3. Offset signal 312 (see FIG. 3) is applied to an analog multiplexer (MUX) 402 together with a zero input, the latter being a connection to Gnda (see FIG. 2B). MUX 402 serves to controllably use the correction voltage(s) received from circuit 310. For example, when MUX 402 selects the zero input, circuit 400 substantially does not perform any correction because signal 428 is changed by zero volts in an analog subtractor 414 However, when MUX 402 selects offset signal 312, that signal is applied via that MUX's output signal 404 to subtractor 414. Subtractor 414 subtracts the voltage provided by offset signal 312 from signal 428, thereby performing signal correction by the amount of local ground-potential offset with respect to the external ground potential induced, e.g., by digital circuit 210 (FIG. 2). An output signal 416 generated by subtractor 414 is applied to an analog buffer 420, where it is buffered and then output from circuit 400 as signal 432. Signal 432 can then be output from the IC having circuit 400, e.g., IC 100 of FIG. 1, by applying that signal to pin Vaout. Since circuits external to IC 100 will reference the signal appearing on pin Vaout to the PCB ground, that signal will have a magnitude that substantially is not affected by the presence of a nonzero offset voltage.

Figure 5:
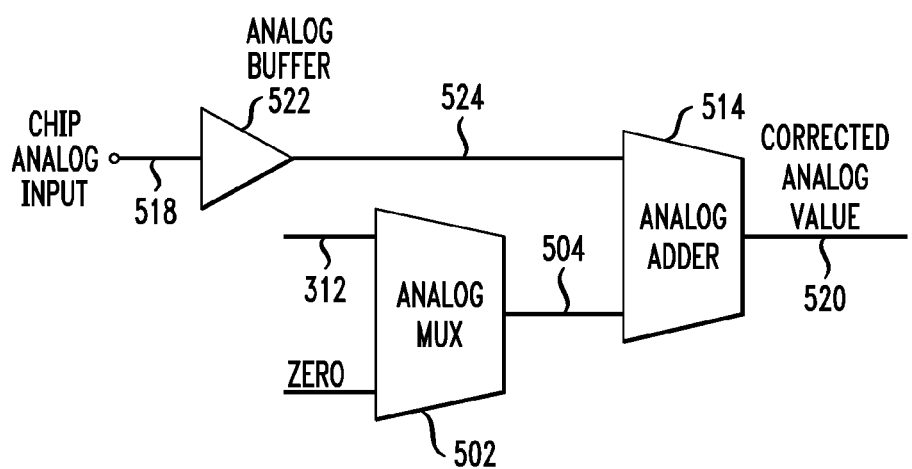
FIG. 5 shows a block diagram of a signal correction circuit that can be used in the OECC shown in FIG. 3 according to another embodiment of the invention.

FIG. 5 shows a block diagram of a signal correction circuit 500 that can be used as circuit 320 (FIG. 3) according to one embodiment of the invention. Similar to circuit 400 of FIG. 4, circuit 500 is adapted to perform signal correction in the analog domain. Circuit 500 receives an analog signal 518 and generates a corrected analog signal 520 that are analogous to signals 318 and 322, respectively, of FIG. 3. Signal 518 is applied to an analog buffer 522, where it is buffered and then applied via the buffer's output signal 524 to an analog adder 514. When an analog multiplexer (MUX) 502 that is similar to MUX 402 (FIG. 4) selects offset signal 312, that signal is applied via the MUX's output signal 504 to analog adder 514. Adder 514 adds the voltage provided by offset signal 312 to signal 524, thereby performing signal correction by the amount of the local-ground-potential offset induced, e.g., by the operation of digital circuit 110 or 210 (FIGS. 1-2).

Figure 6:
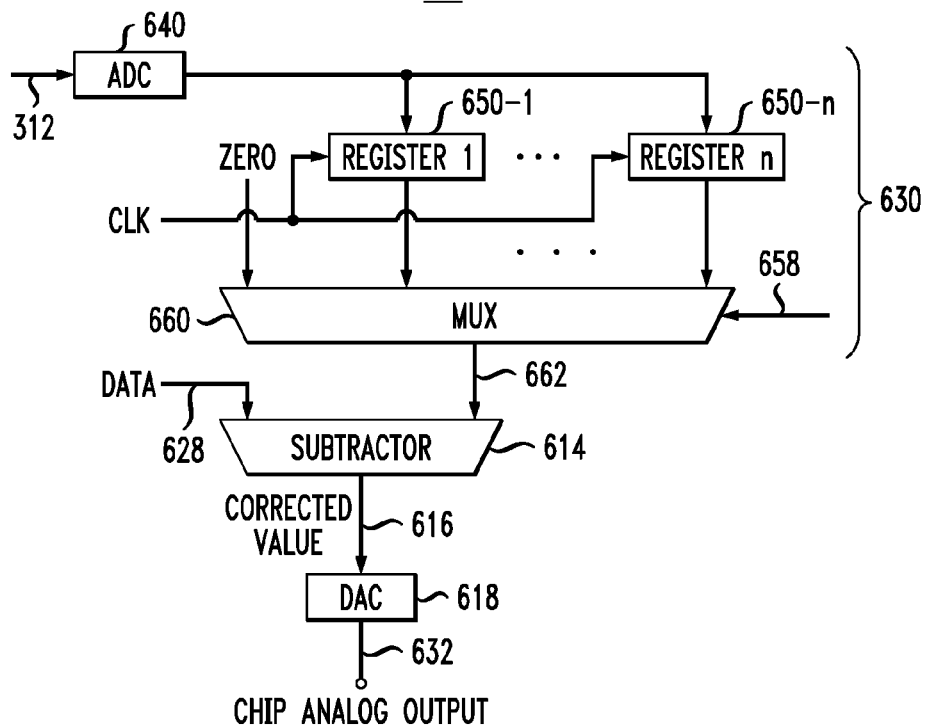
FIG. 6 shows a block diagram of a signal correction circuit that can be used in the OECC shown in FIG. 3 according to yet another embodiment of the invention.

FIG. 6 shows a block diagram of a signal correction circuit 600 that can be used as circuit 330 (FIG. 3) according to another embodiment of the invention. Unlike circuits 400 and 500 (FIGS. 4-5), circuit 600 is adapted to perform signal correction in the digital domain. In addition, signal correction circuit 600 has a digital offset-configuration controller 630 adapted to store, in digital form, various offset values that can be used by the signal correction circuit to generate an output signal 632 that is analogous to signal 332 of FIG. 3. More specifically, these various offset values are stored in controller 630 using a plurality of registers 650-1 ... 650-n, each of which is configured to store a respective offset value written into the register during an initialization procedure performed, e.g., at power up. According to one embodiment of the invention, this initialization procedure is carried out as follows.

Referring to FIGS. 1, 2, 3, and 6, first, IC 100 (FIG. 1) is configured to operate in a first selected regime characterized by a first level of computation activity in digital circuit 110 and resulting in digital current $I_{digital}=I_1$ (see FIG. 2) drawn by that circuit. The value of the offset voltage corresponding to the first level of activity is measured by offset measurement circuit 310 (FIG. 3) and applied via signal 312 to controller 630 (FIG. 6). An analog-to-digital converter (ADC) 640 in controller 630 converts the analog value of the offset voltage received via signal 312 into a corresponding digital value, which is then stored in register 650-1. Next, IC 100 (FIG. 1) is configured to operate in a second selected regime characterized by a second level of computation activity in digital circuit 110 and resulting in digital current $I_{digital}=I_2$ drawn by that circuit. The value of the offset voltage corresponding to this second level of activity is measured by offset measurement circuit 310 (FIG. 3), analog-to-digital converted by ADC 640, and stored in register 650-2 (FIG. 6). The initialization procedure continues in this manner until each register 650 is programmed to store a digital offset value corresponding to a respective level of activity in digital circuit 110.

The outputs of registers 650 in controller 630 are coupled to a MUX 660 (FIG. 6). Note that MUX 660 also receives a digital zero input. The zero input can be used, e.g., when digital circuit 110 substantially has no computation activity at all (i.e., is turned OFF or is idle). During normal operation of circuit 600, MUX 660 can select any one of its inputs based on a control signal 658 and yield the corresponding offset value via an output signal 662. Control signal 658 can be generated, e.g., using the enable/disable signals that control the operation of digital circuit 110 (FIG. 1).

A digital input signal 628 that is analogous to signal 328 of FIG. 3 and signal 662 produced by MUX 660 are applied to a subtractor 614. Digital input signal 628 can be, for example, a digital signal received by analog circuit 120 from digital circuit 110 (FIG. 1) for further processing. Subtractor 614 subtracts the digital value provided by signal 662 from the digital value of signal 628 to generate a digital output signal 616. Signal 616 is then digital-to-analog converted by a DAC 618 to generate an output signal 632 that is analogous to signal 332 of FIG. 3. Since circuits external to IC 100 will reference the signal appearing on pin Vaout to the PCB ground, that signal will have a magnitude that substantially is not affected by the presence of a nonzero offset voltage.

Figure 7:
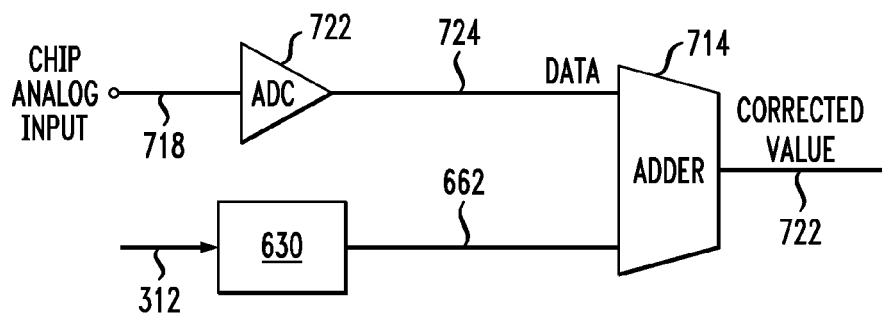
FIG. 7 shows a block diagram of a signal correction circuit that can be used in the OECC shown in FIG. 3 according to yet another embodiment of the invention.

FIG. 7 shows a block diagram of a signal correction circuit 700 that can be used as circuit 320 (FIG. 3) according to another embodiment of the invention. Similar to circuit 600 of FIG. 6, circuit 700 is adapted to perform signal correction in the digital domain. Circuit 700 receives an input signal 718 that is analogous to signal 318 of FIG. 3. Signal 718 is analog-to-digital converted by ADC 722 to generate a corresponding digital signal 724. Signal 724 is applied to an adder 714. Adder 714 adds the digital value provided via signal 662 by controller 630 to the digital value of signal 724 to generate a digital output signal 722 that is analogous to signal 322 (FIG. 3). Note that, in this embodiment, controller 630, which has been described above in the context of circuit 600 (FIG. 6), is now a part of circuit 700.

Note that, while the digital domain correction shown in FIGS. 6 and 7 contains a digital offset-configuration controller 630, the analog domain correction shown in FIGS. 4 and 5 does not contain a similar circuit. However, such an analog offset-configuration controller could be implemented and used in a similar manner in the analog domain correction of FIGS. 4 and 5. More specifically, an analog domain implementation of controller 630 can have the following structure: (1) ADC 640 is omitted; (2) each of registers 650 is replaced by a corresponding analog sample-and-hold circuit; and (3) digital MUX 660 is replaced by an analog MUX. An analog output signal (analogous to signal 662 of FIG. 6) generated by the analog version of controller 630 can be used, e.g., in place of signal 404 (FIG. 4) or signal 504 (FIG. 5).

While this invention has been described with reference to illustrative embodiments, this description is not intended to be construed in a limiting sense. For example, while embodiments of the invention are described in reference to adders and subtractors, one skilled in the art will appreciate that a subtractor can be implemented by an adder configured to add the complement of the signal that is intended to be subtracted. Although embodiments of the invention have been described in reference to a digital circuit, such as digital circuit 110 (FIG. 1) or 210 (FIG. 2), being the circuit that causes fluctuations of a local ground-potential, the invention is not so limited. For example, adverse effects of similar fluctuations caused by any circuit capable of drawing sufficient current and causing nonzero $V_{offset}$ effects can similarly be reduced using the principles of this invention. Although ICs of the invention have been described as being fabricated in wafers having P+ substrates, P− epitaxial layers, and N-wells, these ICs can also be fabricated using other suitable fabrication techniques, e.g., N− substrates, N+ epitaxial layers, and P-wells. Although embodiments of the invention have been described in reference to ground potentials, it can similarly be applied to any reference potentials used in the IC operation. Various modifications of the described embodiments, as well as other embodiments of the invention, which are apparent to persons skilled in the art to which the invention pertains are deemed to lie within the principle and scope of the invention as expressed in the following claims.

As used in this specification, the term "integrated circuit" refers to an interconnected array of active and/or passive elements integrated using one or more substrates and/or deposited on a substrate by a continuous series of compatible processes, and capable of performing at least one complete electronic circuit function. Representative examples of such "integrated circuits" include, but are not limited to (i) a chip having an electronic circuit that is fabricated whole on a single piece of semiconductor material, (ii) a card or pack into which one or more chips have been structurally and functionally incorporated for the card/pack to possess desirable functionality, with the card/pack intended to be part of, e.g., a consumer product, and (iii) a liquid crystal display (LCD) panel or a functional equivalent thereof having a plurality of pixels integrated to form a functional unit.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

Unless explicitly stated otherwise, each numerical value and range should be interpreted as being approximate as if the word "about" or "approximately" preceded the value of the value or range. Throughout the detailed description, the drawings, which are not to scale, are illustrative only and are used in order to explain, rather than limit the invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

I claim:

1. An integrated circuit, comprising:
    a first circuit adapted to be coupled to a terminal held at an external reference potential so that a current passing through the first circuit is coupled to said terminal;
    a second circuit electrically coupled to the first circuit and adapted to generate a signal referenced to a reference potential internal to the integrated circuit, wherein the current causes said internal reference potential to be offset with respect to the external reference potential; and
    a third circuit electrically coupled to the second circuit and adapted to:
        measure an offset voltage; and
        based on the measured offset voltage, adjust the signal referenced to the internal reference potential to reduce signal error associated with the offset between the internal and external reference potentials, wherein the first, second, and third circuits are formed on a common substrate.

2. The integrated circuit of claim 1, further comprising a pin connected to the third circuit and adapted to be connected to said terminal to enable the third circuit to measure said offset voltage.

3. The integrated circuit of claim 2, wherein the third circuit is designed so that substantially no current flows through said pin.

4. The integrated circuit of claim 1, wherein the third circuit comprises an offset measurement circuit adapted to receive the external and internal reference potentials and, based on the received potentials, generate an output signal representing the offset voltage.

5. The integrated circuit of claim 4, wherein:
    the offset measurement circuit comprises a differential amplifier adapted to receive the external and internal reference potentials at said amplifier's differential inputs; and
    the offset measurement circuit is adapted to generate the output signal based on an output signal generated by the differential amplifier.

6. The integrated circuit of claim 4, wherein the third circuit further comprises a signal correction circuit adapted to:
    receive the output signal generated by the offset measurement circuit; and
    apply an adjustment value representing the offset voltage to the signal referenced to the internal reference potential to generate an adjusted signal.

7. The integrated circuit of claim 6, wherein:
    the signal correction circuit is adapted to perform signal adjustment in the analog domain; and
    the adjustment value is an analog value.

8. The integrated circuit of claim 6, wherein:
    the signal correction circuit is adapted to perform signal adjustment in the digital domain; and
    the adjustment value is a digital value.

9. The integrated circuit of claim 6, wherein the signal correction circuit comprises a controller adapted to:
    store one or more values representing adjustment values, and
    controllably select from the stored values a value representing the adjustment value applied to the signal referenced to the internal reference potential.

10. The integrated circuit of claim 9, wherein:
    the controller is (i) configurable based on a present level of activity in the first circuit and (ii) adapted to change the selection based on a change of the present level of activity.

11. The integrated circuit of claim 9, wherein:
    each stored value corresponds to a respective configuration of the first circuit; and the integrated circuit is adapted to:
        detect a present configuration of the first circuit; and
        configure the controller to select a stored value corresponding to said present configuration.

12. The integrated circuit of claim 6, wherein the signal correction circuit comprises:
    an analog-to-digital converter (ADC) adapted to convert the offset voltage into digital form;
    a plurality of registers, each register coupled to the ADC and adapted to store a respective digital value of the offset voltage; and
    a selector coupled to said plurality of registers and adapted to controllably select from the stored values the adjustment value.

13. The integrated circuit of claim 6, wherein the signal correction circuit comprises:
    a plurality of sample-and-hold circuits, each sample-and-hold circuit adapted to hold a respective analog value of the offset voltage; and
    a selector coupled to said plurality of sample-and-hold circuits and adapted to controllably select from the held values the adjustment value.

14. The integrated circuit of claim 6, wherein the adjusted signal is an analog signal.

15. The integrated circuit of claim 6, wherein the adjusted signal is a digital signal.

16. The integrated circuit of claim 1, wherein:
    the first circuit is a digital circuit; and
    the second circuit is an analog circuit.

17. The integrated circuit of claim 1, wherein:
    the internal and external reference potentials are ground potentials.

18. A method of signal generation, comprising:
    passing current through a first circuit of an integrated circuit coupled to a terminal held at an external reference potential so that the current is coupled to said terminal;
    generating a signal referenced to a reference potential internal to the integrated circuit using a second circuit of said integrated circuit, wherein the current causes said internal reference potential to be offset with respect to the external reference potential;
    measuring an offset voltage using a third circuit of said integrated circuit; and
    based on the measured offset voltage, adjusting the signal referenced to the internal reference potential to reduce signal error associated with the offset between the internal and external reference potentials, wherein the first, second, and third circuits are formed on a common substrate.

19. The method of claim 18, wherein the step of adjusting comprises:
applying an adjustment value representing the offset voltage to the signal referenced to the internal reference potential.

20. The method of claim 19, further comprising:
storing one or more values representing adjustment values, and
controllably selecting from the stored values a value representing the adjustment value applied to the signal referenced to the internal reference potential.

* * * * *